(12) United States Patent
Min et al.

(10) Patent No.: US 6,449,195 B1
(45) Date of Patent: Sep. 10, 2002

(54) METHOD AND APPARATUS FOR COUPLING NOISE REDUCTION IN A SEMICONDUCTOR DEVICE

(75) Inventors: Don-Sun Min; Md H Taufique; David D. Barrera, all of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 15 days.

(21) Appl. No.: 09/677,697

(22) Filed: Sep. 28, 2000

(51) Int. Cl.[7] .................................................. G11C 7/00
(52) U.S. Cl. .................................. 365/189.05; 365/154
(58) Field of Search ............................. 365/189.05, 154, 365/156, 63, 206

(56) References Cited

U.S. PATENT DOCUMENTS

| | | | | |
|---|---|---|---|---|
| 5,757,702 A | * | 5/1998 | Iwata et al. .................. | 365/154 |
| 6,111,797 A | * | 8/2000 | Shirley .................... | 365/189.05 |
| 6,160,742 A | * | 12/2000 | Chung et al. .......... | 365/189.06 |

* cited by examiner

Primary Examiner—A. Zarabian

(74) Attorney, Agent, or Firm—Joanna G. Chiu

(57) ABSTRACT

An integrated circuit is disclosed that includes a first signal line adjacent to a second signal line. A first latch is coupled between the first and second signal line. The first latch includes a first transistor having a first current electrode coupled to the first signal line and a control electrode coupled to the second control line and a second transistor having a first current electrode coupled to the second signal line and a control electrode coupled to the first signal line. The first signal line typically runs substantially parallel to the second signal line. A signal generator circuit may be coupled to a first end of the first and second signal lines and a receiver circuit may be coupled to a second end of the first and second signal line. The first latch may be coupled closer to the second end of the first and second signal lines than the first end of the first and second signal lines. In one embodiment, the signal generator circuit comprises a precharge circuit that precharges the first and second signal lines to a predetermined voltage such as a low state or a high state. The circuit may include additional signal lines and additional latches where a latch is coupled between each pair of adjacent signal lines. In an embodiment in which the latch transistors are NMOS transistors, the second current electrodes of each of the transistors is coupled to a ground node. The signal lines may comprise the word lines of a semiconductor memory.

23 Claims, 2 Drawing Sheets

METHOD AND APPARATUS FOR COUPLING NOISE REDUCTION IN A SEMICONDUCTOR DEVICE

FIELD OF THE INVENTION

The present invention is related to the field of semiconductor devices and more particularly, a method and design for reducing coupling in adjacent interconnects in a semiconductor device.

RELATED ART

Continuous advancements in the field of semiconductor fabrication have resulted in integrated circuits with millions of deep sub-micron transistor geometries connected by closely spaced signal lines (interconnects). The coupling noise between adjacent signal lines in devices with single and multiple interconnect levels has become a significant design concern. Coupling noise is extremely sensitive to scaling and is considered to be a major obstacle to achieving reliable, high speed and high density integrated circuits. In semiconductor memories particularly, the degree of coupling noise due to closely spaced signal lines in the memory cell array is a constraining factor on the speed and reliable operation of the device.

Historically, one method of reducing coupling noise between adjacent interconnects includes the placement of shielding lines between adjacent signal lines. Typically, the shielding lines are tied to a constant voltage supply such as VDD or ground. Shielding lines are considered to be one of the best methods for reducing coupling noise, but the penalty area incurred by shielding is so significant that the shielding line method can not be extensively used for applications such as semiconductor memories in which the number of bit lines and word lines is extremely large.

A second method of reducing coupling noise includes the use of bit-line/bit-line-bar pairs that are twisted such that, at a first location the bit-line interconnect is adjacent to a neighboring bit-line while, at a second location, the bit-line-bar interconnect is adjacent to the neighboring bit line. The twisting pair method can reduce coupling noise by almost half, but is typically limited to paired lines that switch simultaneously such as the bit line pairs in a semiconductor memory array. The twisting line method typically cannot be applied to decoder output lines or other applications where only one output is switching to either high or low while the rest of the outputs remain un-switched. Therefore, it would be desirable to implement a method of reducing coupling noise in densely spaced integrated circuits without significantly increasing the area of the array using a method that would be applicable to applications in which only one output transitions at a time.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Generally speaking, embodiments of the invention contemplate a method and semiconductor design for reducing coupling noise between adjacent interconnects in a semiconductor device. Cross coupled latches are placed between each pair of neighboring interconnects such that any two neighboring interconnects running parallel to a selected switching signal are maintained at an undisturbed signal level with the aide of the cross coupled latches. Embodiments of the invention are applicable to any, decoded output line such as an application in which a single output line switches while the rest of the output lines remain unchanged. A typical application suitable for implementing embodiments of the present invention includes the word lines or row/column decoders in a semiconductor memory where conventional shielding and twisting pair or methods are not feasible due to the layout area penalty.

Figure 1:
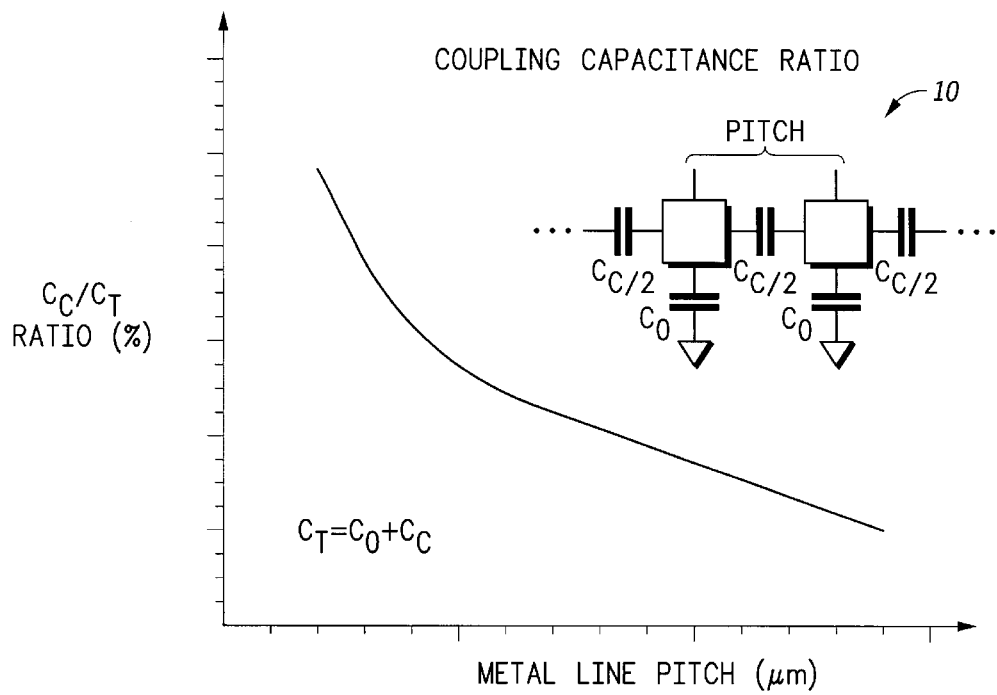
FIG. 1 is a graph illustrating coupling capacitance as a function of metal line pitch.

Turning now to the drawings, FIG. 1 illustrates the coupling capacitance ratio as a function of metal line pitch for a pair of adjacent and typically parallel interconnects. As depicted, the capacitance associated with a pair of adjacent interconnects includes a cross coupled capacitance ($C_C/2$) between adjacent interconnects. In addition, each interconnect is associated with a self-capacitance ($C_0$) such that the total capacitance associated with each interconnect ($C_T$) = ($C_0$)+2*($C_C/2$).

The cross capacitance increases as the pitch between the adjacent interconnects decreases such that the ratio of the cross capacitance to the total capacitance increases as metal line pitch decreases. When the cross capacitance ratio increases beyond a specified threshold, cross coupling noise becomes a significant limitation in the ability to operate the semiconductor device reliably at high speeds. Embodiments of the present invention contemplate a structure for reducing the cross coupling by adding a cross coupled transistor latch between adjacent pairs of interconnects.

Figure 2:
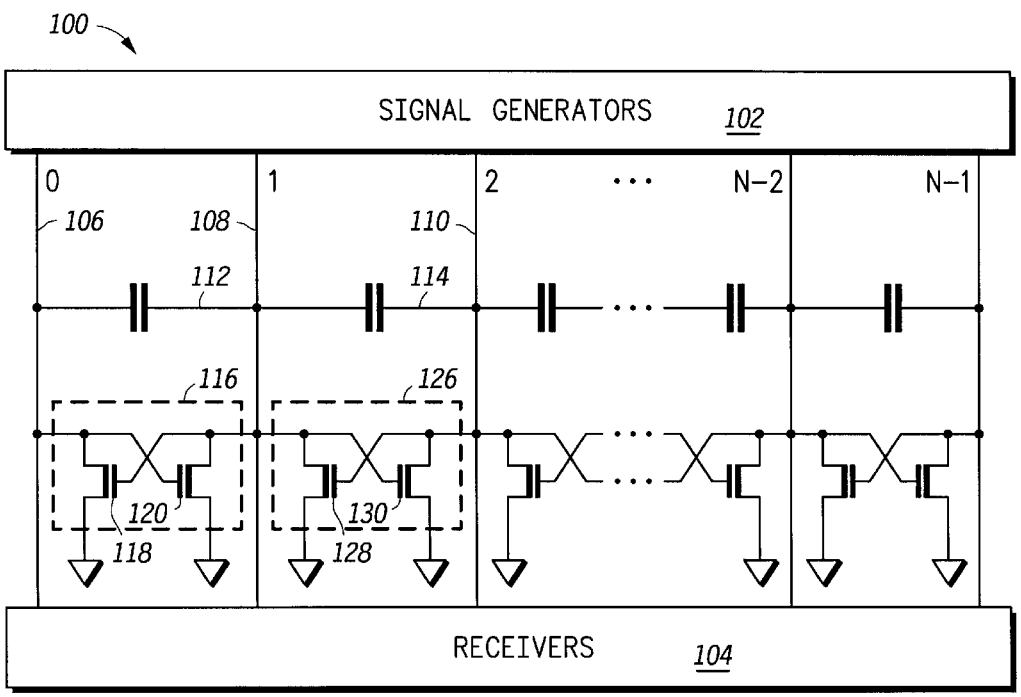
FIG. 2 is a diagram of a portion of an integrated circuit in accordance with one embodiment of the invention.

Turning now to FIG. 2, a portion of an integrated circuit 100 includes a first signal line 106 adjacent to a second signal line 108. The cross capacitance between first signal line 106 and second signal line 108 is represented in FIG. 2 by the capacitor 112. A first latch 116 is coupled between first signal line 106 and second signal line 108. First latch 116 includes a first NMOS transistor 118 and a second NMOS transistor 120. The control gate of second NMOS transistor 120 is coupled to a first current terminal (drain) of first NMOS transistor 118 and to the first signal line 106. The control terminal of first transistor 118 is coupled to a first current terminal (drain) of second transistor 120 and to the second signal line 108. The second current terminals (sources) of first NMOS transistor 118 and second NMOS transistor 120 are grounded. In the depicted embodiment of integrated circuit 100, first and second signal lines 106 and 108 are coupled to a signal generator 102 at a first end of the signal lines while the second end of the signal lines are coupled to receivers 104. Signal generators 102 may comprise, for example, a word line driver in a semiconductor memory, a row decoder, or a column decoder.

In one embodiment, first and second signal lines 106 and 108 are precharged low. When the signals lines are in their precharged condition, first transistor 118 and second transistor 120 of latch 116 are off. If one of the signal lines, such as first signal line 106, transitions from its precharged low state to a high state, the control gate of second transistor 120, which is coupled to first signal line 106, will turn on. When second transistor 120 turns on, a conductive path between the first current terminal of transistor 120 and ground is formed. This conductive path, which is coupled to second signal 108, provides additional grounding for second signal line 108 thereby reducing any cross coupling voltage spike on second signal line 108 caused by the transition in first signal line 106. Similarly, if second signal line 108 transitions from a precharged low state to a high state, the control gate of first transistor 118 turns on thereby providing a ground path between first signal line 106 and ground to reduce the voltage spike on first signal line 106.

Typically, integrated circuit 100 will include a plurality of signal lines including first signal line 106, second signal line 108, and third signal line 110 where first and second signal lines 106 and 108 are adjacent signal lines and second signal line 108 and third signal line 110 are adjacent signal lines. As depicted in FIG. 2, integrated circuit 100 includes a first latch 116 coupled between first signal line 106 and second signal line 108 and a second latch 126 coupled between second signal line 108 and third signal line 110. Like first latch 116, second latch 126 includes a first transistor 128 and a second transistor 130 where the control gate of second transistor 130 is coupled to second signal 108 and a first current terminal of first transistor 128. The control gate of first transistor 128 is coupled to third signal line 110 and a first current terminal of second transistor 130. In this configuration, cross coupling noise between second signal line 108 and each of its adjacent signal lines 106 and 110 is reduced by the corresponding latch 116 or 126. Thus, if second signal line 108 transitions from a low state to a high state, first latch 116 minimizes cross coupling noise on first signal line 106 while second latch 126 minimizes cross coupling noise on third signal line 110. Integrated circuit 100 may include an arbitrary number of signal lines where a latch is coupled between each adjacent pair of signal lines.

Figure 3:
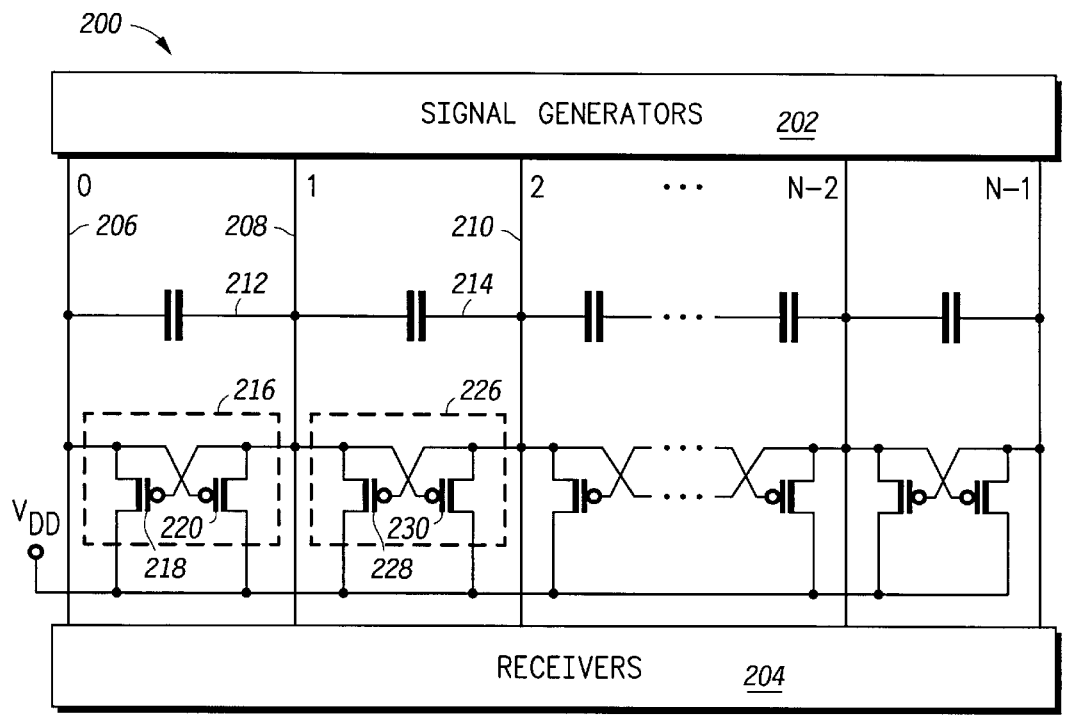
FIG. 3 is a circuit diagram of a portion of a semiconductor device according to one embodiment of the invention.

Turning now to FIG. 3, an integrated circuit 200 according to an alternative embodiment of the present invention is depicted. In this embodiment, integrated circuit 200 includes a first signal line 206 and an adjacent second signal line 208 that have a cross capacitance 212 between them. A first latch 216 is coupled between first signal 206 and second signal 208. First latch 216 includes a first PMOS transistor 218 and a second PMOS transistor 220. The control gate of first PMOS transistor 218 is coupled to a first current terminal (drain) of second PMOS transistor 220 and to second signal line 208. The control gate of second PMOS transistor 220 is coupled to the first current terminal (drain) of first transistor 218 and to second signal line 206. The second current terminals (sources) of first and second PMOS transistors 218 and 220 are coupled to VDD.

In one embodiment, first signal line 206 and second signal line 208 comprise a first word line and a second word line. that are driven by a signal generator 202 where the signal generator 202 comprises a word line driver in a semiconductor memory array. In this embodiment, the first and second signal lines 206 and 208 are precharged to a high state in which both of the transistors 218 and 220 in latch 216 are off. If either first signal line 206 or second signal line 208 subsequently transitions from the precharged high state to a low state, one of the transistors in latch 216 will turn on providing a path between VDD and the other signal line thereby reducing the voltage spike on the non-transitioning line.

Integrated circuit 200 may include additional signal lines such as a third signal line 210 adjacent to second signal line 208 where the cross capacitance between second and third signal lines 208 and 210 is indicated by the cross capacitance 214. A second latch 226 comprised of a first PMOS transistor 228 and a second PMOS transistor. 230 is coupled between this pair of signal lines. First and second transistors 228 and 230 of second latch 226 are coupled in a similar fashion to the first latch 216 such that the second latch 226 minimizes cross coupling voltage spikes between second signal line 208 and third signal line 210. Integrated circuit 200 may include an arbitrary number of signal lines where a cross coupled latch couples each pair of adjacent signal lines.

Figure 4:
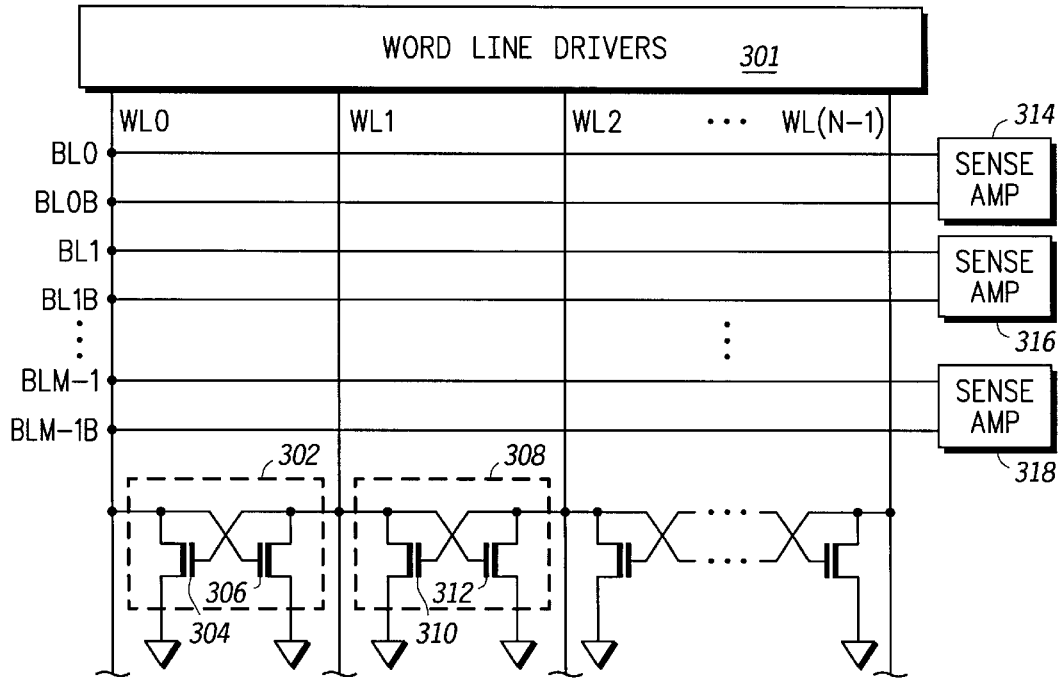
FIG. 4 is a circuit diagram of a semiconductor memory array according to one embodiment of the invention.

Turning now to FIG. 4, a semiconductor memory array implementation of the present invention is depicted. In this embodiment, the integrated circuit includes wordline drivers 301 that drive a set of wordlines WL0, WL1, . . . WL(N−1). The integrated circuit further includes a plurality of bit line pairs including a first bit line pair comprised of bit line zero (BL0) and bit line zero bar (BL0B) a second bit line pair (BL1) and (BL1B) and so forth. Each bit line pair is coupled to a corresponding sense amp. In the depicted embodiment, the first bit line pair is coupled to a first sense amp 314, a second bit line pair is coupled to a second sense amp 316, and a subsequent bit line pair is coupled to a third sense amp 318. A cross coupled latch is coupled between each adjacent pair of word lines. A first cross coupled latch 302 is coupled between a first word line WL0 and second word line WL1, a second cross coupled latch 308 is coupled between second word line WL1 and third word line WL2, and so forth.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit, comprising:
a first signal line adjacent to a second signal line;
a first latch coupled between the first and second signal line, wherein the first latch includes:
a first transistor having a first current electrode coupled to the first signal line and a control electrode coupled to the second control line, and
a second transistor having a first current electrode coupled to the second signal line and a control electrode coupled to the first signal line;
a third signal line adjacent to the second signal line; and
a second latch coupled between the second and third signal lines, wherein the second latch includes:
a third transistor having a first current electrode coupled to the second signal line and a control electrode coupled to the third signal line, and a fourth transistor having a first current electrode coupled to the third signal line and a control electrode coupled to the second signal line.

2. The integrated circuit of claim 1, wherein the first signal line runs substantially parallel to the second signal line.

3. The integrated circuit of claim 1, further comprising a signal generator circuit coupled to a first end of the first, second, and third signal lines.

4. The integrated circuit of claim 3, further comprising a receiver circuit coupled to a second end of the first, second, and third signal lines, wherein the first latch and the second latch are coupled closer to the second end of the first, second, and third signal lines than the first end of the first, second, and third signal lines.

5. The integrated circuit of claim 3, wherein the signal generator circuit comprises a precharge circuit that precharges the first and second signal lines to a predetermined voltage.

6. The integrated circuit of claim 5, wherein the predetermined voltage is one of a low state and a high state.

7. The integrated circuit of claim 2, wherein the third signal line runs substantially parallel to the second signal line.

8. The integrated circuit of claim 1, wherein:
   the first transistor has a second current electrode coupled to a voltage supply node;
   the second transistor has a second current electrode coupled to the voltage supply node;
   the third transistor has a second current electrode coupled to the voltage supply node; and
   the fourth transistor has a second current electrode coupled to the voltage supply node.

9. The integrated circuit of claim 1, wherein each one of the first, second, third, and fourth transistors comprises one of an NMOS and a PMOS transistor.

10. The integrated circuit of claim 1, wherein the signal lines are of a type selected from a group consisting of word lines and row/column decoders.

11. An integrated circuit, comprising:
   a word line driver circuit;
   a first word line coupled to the word line driver circuit;
   a second word line, adjacent to the first word line, coupled to the word line driver circuit;
   a first latch coupled between the first and second word lines, wherein the first latch includes:
      a first transistor having a first current electrode coupled to the first word line and a control electrode coupled to the second word line; and
      a second transistor having a first current electrode coupled to the second word line and a control electrode coupled to the first word line.

12. The integrated circuit of claim 11, wherein:
   the first transistor has a second current electrode coupled to a voltage supply node; and
   the second transistor has a second current electrode coupled to the voltage supply node.

13. The integrated circuit of claim 11, further comprising:
   a third word line adjacent to the second word line;
   a second latch coupled between the second and third word lines, wherein the second latch includes:
      a third transistor having a first current electrode coupled to the second word line and a control electrode coupled to the third word line, and
      a fourth transistor having a first current electrode coupled to the third word line and a control electrode coupled to the second word line.

14. The integrated circuit of claim 11, further comprising:
   a first bitline and a second bitline, each coupled to the first and second word lines; and
   a sense amplifier coupled to the first and second bitline.

15. An integrated circuit, comprising:
   a first signal line adjacent to a second signal line;
   a first latch coupled between the first and second signal line, the first latch reducing cross coupling noise upon a transition of the second signal line from a first state to a second state, wherein the first latch includes:
      a first transistor having a first current electrode coupled to the first signal line and a control electrode coupled to the second control line, and
      a second transistor having a first current electrode coupled to the second signal line and a control electrode coupled to the first signal line.

16. The integrated circuit of claim 15, wherein the first signal line runs substantially parallel to the second signal line.

17. The integrated circuit of claim 15, further comprising a signal generator circuit coupled to a first end of the first and second signal lines.

18. The integrated circuit of claim 17, further comprising a receiver circuit coupled to a second end of the first and second signal lines, wherein the first latch is coupled closer to the second end of the first and second signal lines than the first end of the first and second signal lines.

19. The integrated circuit of claim 17, wherein the signal generator circuit comprises a precharge circuit that precharges the first and second signal lines to a predetermined voltage.

20. The integrated circuit of claim 19, wherein the predetermined voltage is one of a low state and a high state.

21. The integrated circuit of claim 15, further comprising:
   a third signal line adjacent to the second signal line;
   a second latch coupled between the second and third signal lines, the second latch reducing cross coupling noise upon the transition of the second signal line from the first state to the second state, wherein the second latch includes:
      a third transistor having a first current electrode coupled to the second signal line and a control electrode coupled to the third signal line, and
      a fourth transistor having a first current electrode coupled to the third signal line and a control electrode coupled to the second signal line.

22. The integrated circuit of claim 21, wherein:
   the first transistor has a second current electrode coupled to a voltage supply node;
   the second transistor has a second current electrode coupled to the voltage supply node;
   the third transistor has a second current electrode coupled to the voltage supply node; and
   the fourth transistor has a second current electrode coupled to the voltage supply node.

23. The integrated circuit of claim 15, wherein:
   the first transistor has a second current electrode coupled to a voltage supply node; and
   the second transistor has a second current electrode coupled to the voltage supply node.

* * * * *

UNITED STATES PATENT AND TRADEMARK OFFICE
CERTIFICATE OF CORRECTION

PATENT NO.     : 6,449,195 B1                                            Page 1 of 1
DATED          : September 10, 2002
INVENTOR(S)    : Dong-Sun Min et al.

It is certified that error appears in the above-identified patent and that said Letters Patent is hereby corrected as shown below:

<u>Title page,</u>
Item [75], Inventors, change "Don-Sun Min" to -- Dong-Sun Min --; and change "Md H Taufique" to -- MD H. Taufique --

Signed and Sealed this

Twenty-second Day of July, 2003

JAMES E. ROGAN
*Director of the United States Patent and Trademark Office*